United States Patent

Salvi et al.

[11] Patent Number: 5,903,196
[45] Date of Patent: May 11, 1999

[54] SELF CENTERING FREQUENCY MULTIPLIER

[75] Inventors: Raul Salvi, Boca Raton; Ramon Ponce, Sunrise; Armando J. Gonzalez, Miami, all of Fla.

[73] Assignee: Motorola, Inc., Schaumburg, Ill.

[21] Appl. No.: 08/835,372

[22] Filed: Apr. 7, 1997

[51] Int. Cl.⁶ ........................................ H03L 7/08
[52] U.S. Cl. .................. 331/16; 331/53; 331/76; 455/260; 455/76; 455/313; 455/323; 327/105
[58] Field of Search ................... 331/76, 53, 1 A, 331/16; 327/105, 107, 116, 119, 156; 375/376; 455/323, 76, 260, 261, 313, 319

[56] References Cited

U.S. PATENT DOCUMENTS

| | | |
|---|---|---|
| 4,797,637 | 1/1989 | Kegasa et al. ........................... 331/4 |
| 4,888,564 | 12/1989 | Ishigaki ................................. 331/1 A |
| 5,121,015 | 6/1992 | Ngo . |
| 5,438,300 | 8/1995 | Saban et al. ............................. 331/16 |
| 5,568,098 | 10/1996 | Horie et al. ............................. 331/16 |

OTHER PUBLICATIONS

Lammers, David, "Hitachi Jumps into GSM–Silicon Arena," *Electronic Engineering Times*, Feb. 10, 1997 Reader Service No. 49.

*Primary Examiner*—Arnold Kinkead
*Attorney, Agent, or Firm*—Val Jean F. Hillman

[57] ABSTRACT

A frequency multiplier (120) having a tunable resonant circuit (122), is anticipated for use with a frequency synthesizer (100) having a Voltage Controlled Oscillator (110). The VCO control line (116) voltage establishes the VCO (110) fundamental frequency ($f_o$) as well as the resonant circuit (122) center frequency, such that the resonant circuit (122) frequency response will track a desired harmonic component within the multiplier output (130) even as the VCO control line (116) voltage and the fundamental frequency ($f_o$) change in response to control line variation.

6 Claims, 3 Drawing Sheets

SELF CENTERING FREQUENCY MULTIPLIER

TECHNICAL FIELD

This invention relates in general to frequency synthesizer circuits and particularly to frequency multiplier circuits used in association with frequency synthesizers. Specifically, the present invention relates to an apparatus for controlling the band center of a narrow band multiplier used in association with a Phase Locked Loop (PLL) frequency synthesizer.

BACKGROUND

Phase Locked Loop (PLL) frequency synthesizers are well known in the art. One of the more recognizable components of a conventional PLL frequency synthesizer is the voltage controlled oscillator (VCO). The primary function of the VCO is to provide a frequency response output as a function of voltage input signal amplitude.

One application to which a VCO controlled frequency synthesizer can be placed is that of a frequency multiplier. In such an application, the VCO output of the PLL frequency synthesizer is connected to a multiplier circuit that generates a product representation of the VCO output. The advantages typically associated with such a multiplier is the ability to multiply the output of the VCO such that a plurality of harmonic components of a single output can be generated simultaneously. By way of example, such an operation may be used to generate a VCO signal that is not in band with a transmitted or received signal.

Despite the advantages associated therewith, one of the remaining challenges associated with this type multiplier is the ability to maximize both the harmonic content and sub-harmonic rejection during a wide band operation when a narrow band resonant tank is employed for frequency selection. Traditional methods must either accept inferior performance; namely reduced noise isolation and decreased harmonic rejection, or incur the additional expense associated with complex cascade filter stage designs which are typically labor intensive, expensive, and susceptible to environmentally induced variations such as temperature, humidity, altitude, etc.

It would be extremely advantageous therefore to provide a frequency multiplier circuit for use with a PLL or other frequency synthesizer application, which exhibits high harmonic to fundamental rejection and exceptional noise isolation all in a simple design which is cost efficient, robust, and capable of operating across a wide bandwidth of operation, such as, for example, 800–900 Megahertz (MHz).

DETAILED DESCRIPTION OF THE PREFERRED EMBODIMENT

Figure 1:
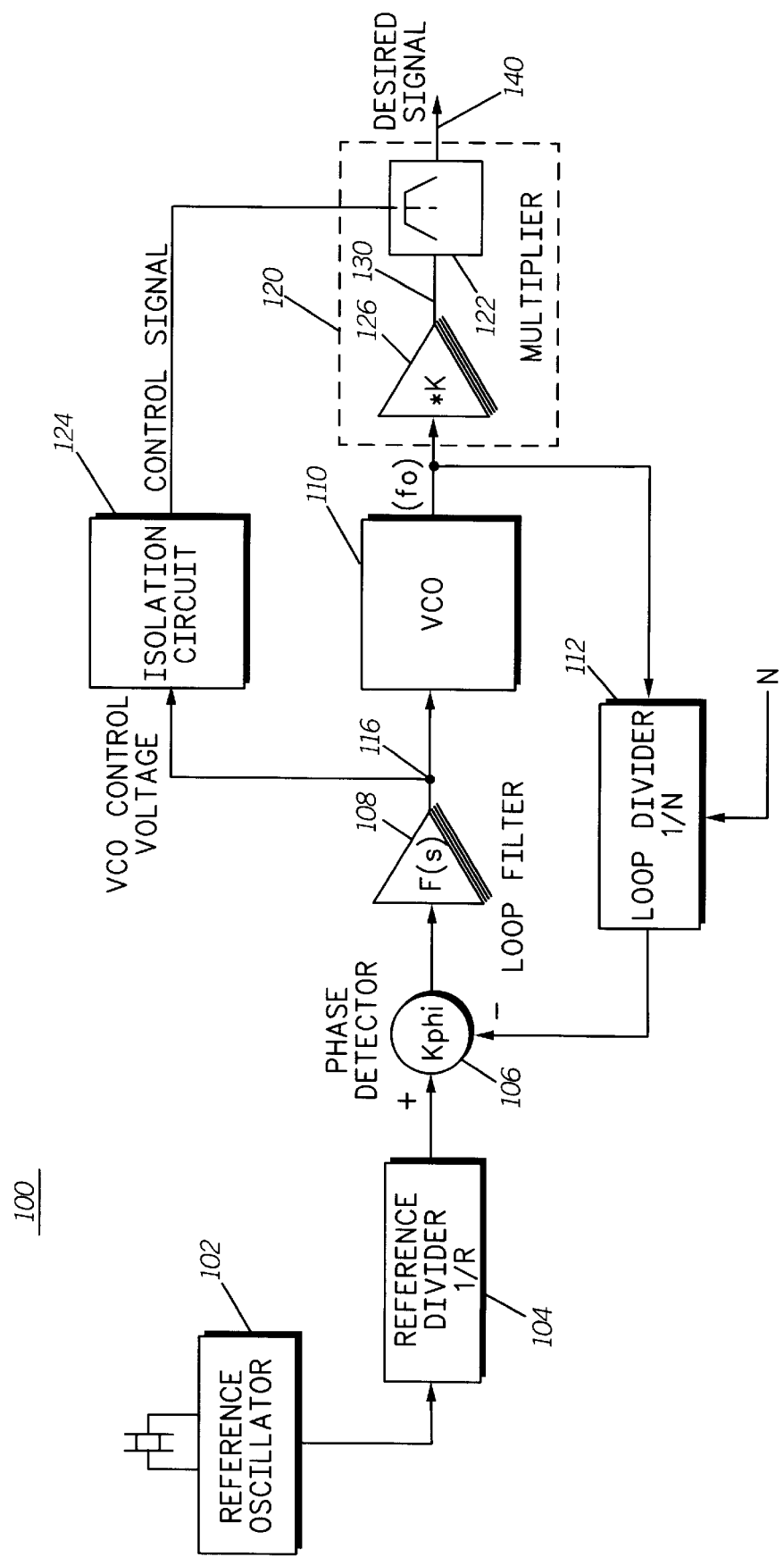
FIG. 1 is a block diagram of a Phase-Locked Loop (PLL) circuit employing the self centering frequency multiplier circuit of the present invention.

While the specification concludes with claims defining the features of the invention that are regarded as novel, it is believed that the invention will be better understood from a consideration of the following description in conjunction with the drawing figures, in which like reference numerals are carried forward.

FIG. 1 is a block diagram of Phase Locked Loop (PLL) circuit 100 employing the self centering frequency multiplier circuit 120 of the present invention. As depicted, PLL circuit 100 employs a reference oscillator 102, reference divider 104, phase detector 106, loop filter 108, VCO 110, and loop divider 112. Such circuits are known in the art and will not, therefore, be described in great detail. The interested reader may refer to U.S. Pat. No. 4,975,650 Martin, issued Dec. 4, 1990, and assigned to the assignee of the present application, for additional detail on circuit 100 theory, design, and operation. Suffice it to say, however, VCO output (ƒo) is established by setting or programming the value N of loop divider 112. The resultant VCO control voltage 116 will thereafter determine the frequency $(f_o)$ of VCO 110.

During operation, VCO output $(f_o)$ is supplied to frequency multiplier circuit 120 having a gain stage 126 which generates an output 130 comprised of the fundamental frequency $(f_o)$ and a plurality of harmonic components ($2f_o$, $3f_o$, $4f_o$ etc.,). In order to maximize the harmonic content and sub-harmonic rejection during a wide band operation, the VCO control line 116 voltage is communicated to a resonant tank structure 122 via noise isolation stage 124. As will be discussed herein, the VCO control line voltage alters the reactance of a variable reactance device within the resonant tank circuit 122 to tune or adjust the band center of the resonate tank structure 122, thereby selecting a desired harmonic components ($2f_o$, $3f_o$, $4f_o$ etc.,) of the multiplier output to derive a desired signal 140. Because the VCO control line operates to control both the VCO 110 and the resonant tank circuit 122, the resonant tank circuit 122 frequency response will now track a desired harmonic component even as the VCO control line voltage changes in amplitude. Herein lies the advantage of the present invention; namely, the VCO control line 116 voltage is a control signal having an amplitude that corresponds to the VCO 110 output frequency $(f_o)$ and likewise corresponds to the desired harmonic component of the multiplier output, such as, for example, $(2f_o)$. In accordance, the self centering multiplier circuit 120 of the present invention will employ a narrow band design for better noise isolation and harmonic rejection.

Figure 2:
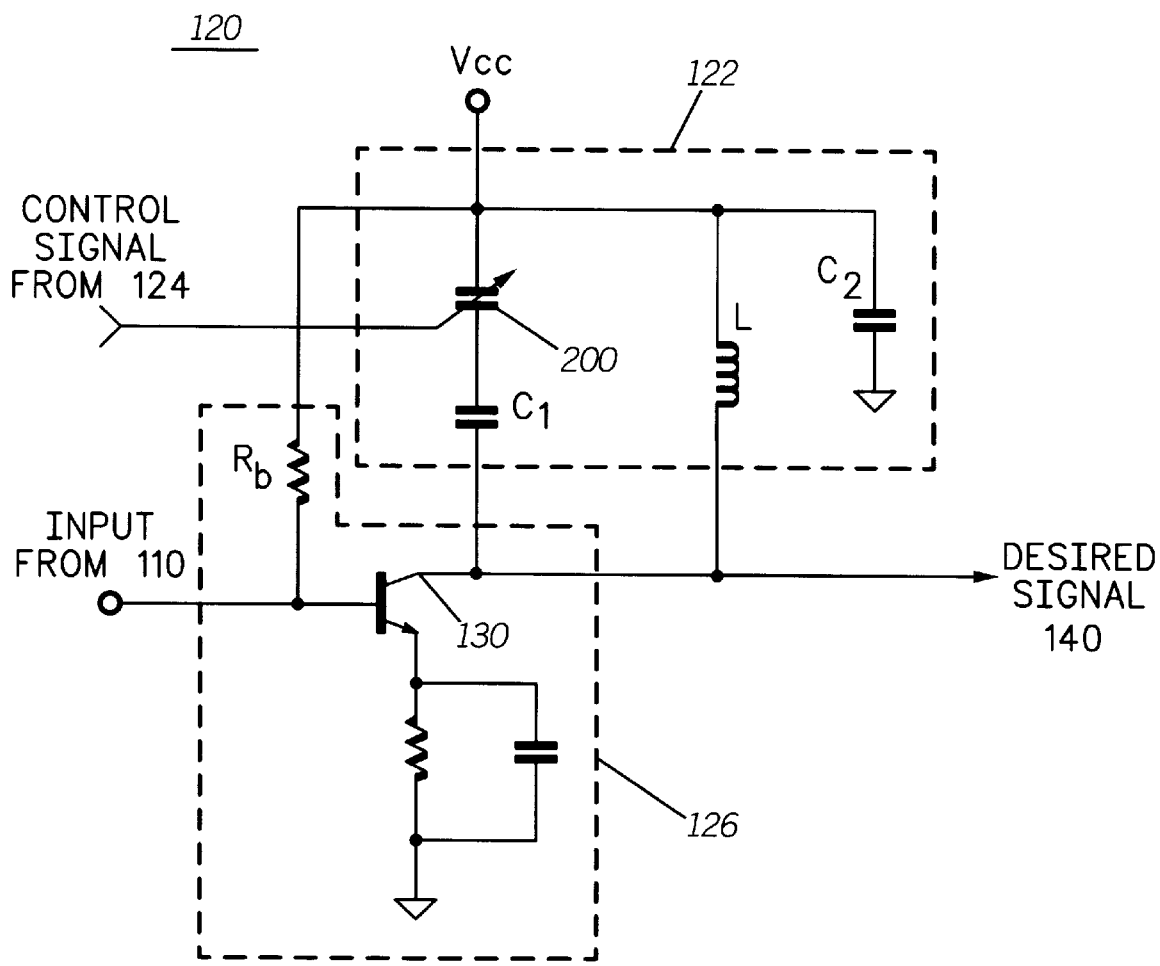
FIG. 2 is a detailed circuit diagram of the self centering frequency multiplier circuit of FIG. 1.

FIG. 2 is a detailed circuit diagram of a preferred embodiment of the self centering frequency multiplier circuit of FIG. 1. As depicted, the circuit 120 comprises a gain stage 126 that receives an input from VCO 110 of FIG. 1 and amplifies the input by some value K. A resonant tank circuit 122 is coupled to the gain stage 126 and employs a variable reactance stage 200, such as a voltage variable capacitor (VVC), a varactor, or any other variable reactance device now known or later created, and capable of receiving a control signal from noise isolation circuit 124 and altering the reactance of the variable reactance stage 200 in response to control signal change, to establish a response for the resonant tank circuit 122 that selects a desired harmonic frequency component, such as, for example $(2f_o)$, from among the plurality of harmonic components within gain stage output.

As will be appreciated by those skilled in the art after review hereof, the resonant tank circuit 122 provides a high impedance response at the desired harmonic frequency while providing a low impedance response at or around the fundamental frequency $(f_o)$. This can be best seen and understood with reference to FIG. 3.

Figure 3:
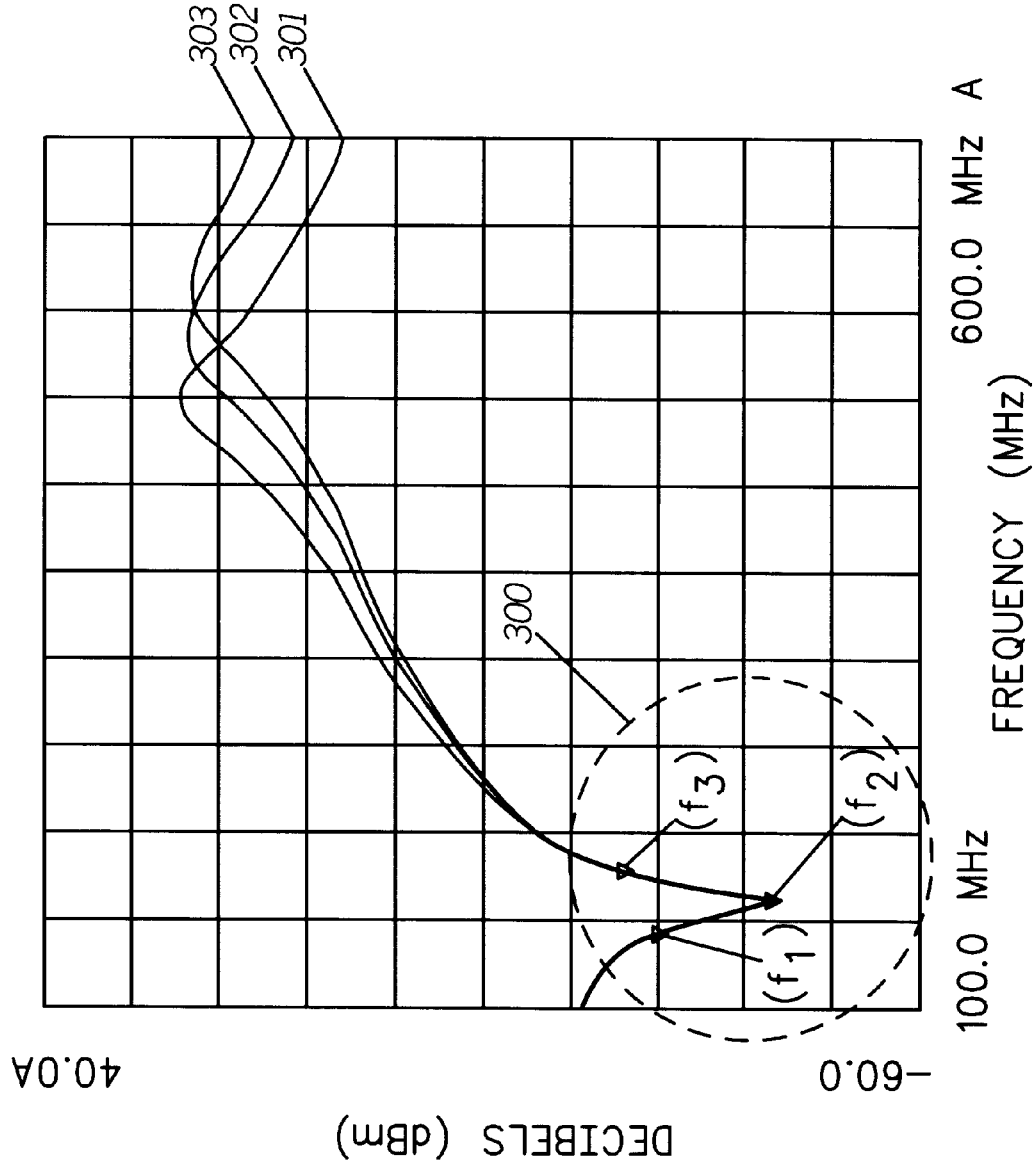
FIG. 3 is a diagram representing the output of the self centering frequency multiplier of the present invention during operation.

FIG. 3 is a diagram representing the desired output 140 of the self centering frequency multiplier 120 of the present invention. As will be appreciated upon review thereof, the area denoted as 300 is the low impedance response established by resonant tank circuit elements L and $C_2$ of FIG. 2 in order to provide fundamental frequency ($f_o$) rejection. The curves designated 301, 302 and 303, represent respective desired frequency signals selected in response to changes in the VCO control line voltage that generated respective fundamental frequencies $f_1$, $f_2$, and $f_3$. Since the VCO control line voltage operates to control both the fundamental frequency ($f_o$) output by the VCO 110 as well as the resonant tank circuit 122, the resonant tank circuit 122 frequency response will now track a desired harmonic component even as the VCO control line 116 voltage changes in amplitude as clearly pointed out in FIG. 3.

While the preferred embodiment of the invention has been illustrated and described, it will be clear that the invention is not so limited. Numerous modifications, changes, variations, substitutions and equivalents will occur to those skilled in the art without departing from the spirit and scope of the present invention as defined by the appended claims. For example, the variable reactance stage 200 of FIG. 2 and control line 116 may be replaced by a device and control line arrangement that are not of the voltage control type.

Notwithstanding, it will be appreciated by those skilled in the art that the invention of the present application operates to provide a self-centering frequency multiplier that avoids the limitations of the prior art; namely, high-cost or noise-prone frequency multiplication.

What is claimed is:

1. A self centering frequency multiplier circuit comprising:

a voltage controlled oscillator (VCO) for receiving a control signal and providing a frequency output in response thereto;

a multiplier circuit, coupled to the VCO, for receiving the frequency output and providing a product signal in response thereto, said product signal having a fundamental frequency and a plurality of harmonic components; and a resonant circuit, coupled to the multiplier circuit and having a voltage variable reactance stage, for receiving the control signal and altering a reactance of the voltage variable reactance stage in response to the control signal amplitude, to establish a frequency response for the resonant circuit that selects a desired harmonic frequency component from among the plurality of harmonic components.

2. The circuit of claim 1 further comprising an isolation circuit, coupled to the VCO and the multiplier, for receiving the control signal and feeding the control signal forward to the voltage variable reactance stage of the resonant circuit.

3. The circuit of claim 1 wherein the resonant circuit provides a high impedance response at the desired harmonic frequency.

4. The circuit of claim 1 wherein the resonant circuit provides a low impedance response at the fundamental frequency.

5. The circuit of claim 1 wherein the resonant circuit frequency response tracks the VCO output.

6. A communications device having a frequency synthesizer, said frequency synthesizer comprising:

a voltage controlled oscillator (VCO) for receiving a control signal and providing a frequency output in response thereto;

a multiplier circuit, coupled to the VCO for receiving the frequency output and providing a product signal in response thereto, said product signal having a fundamental frequency and a plurality of harmonic components;

a resonant circuit, coupled to the multiplier circuit, and having a variable reactance stage for receiving the control signal and altering a reactance of the variable reactance stage in response to control signal amplitude, to establish a response for the resonant circuit that tracks a response for desired harmonic within the product signal; and an isolation circuit, coupled to the resonant circuit and the VCO, for receiving the control signal and feeding the control signal forward to the voltage variable reactance stage.

* * * * *